(12) United States Patent
Choe et al.

(10) Patent No.: US 8,339,489 B2
(45) Date of Patent: Dec. 25, 2012

(54) IMAGE PHOTOGRAPHING APPARATUS, METHOD AND MEDIUM WITH STACK-TYPE IMAGE SENSOR, COMPLEMENTARY COLOR FILTER, AND WHITE FILTER

(75) Inventors: Won-Hee Choe, Gyeongju-si (KR); Chang-Yeong Kim, Yongin-si (KR); Seong-Deok Lee, Suwon-si (KR); Hyun-Chul Song, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 810 days.

(21) Appl. No.: 11/812,951

(22) Filed: Jun. 22, 2007

(65) Prior Publication Data
US 2008/0068475 A1   Mar. 20, 2008

(30) Foreign Application Priority Data
Sep. 19, 2006   (KR) .......................... 10-2006-0090888

(51) Int. Cl.
*H04N 5/335*   (2006.01)
(52) U.S. Cl. .................... 348/276; 348/294; 250/339.05; 257/440
(58) Field of Classification Search .................. 348/276, 348/216.1, 236, 238, 277, 294; 257/440; 250/339.05
See application file for complete search history.

(56) References Cited

U.S. PATENT DOCUMENTS

| | | | | |
|---|---|---|---|---|
| 4,403,247 | A * | 9/1983 | Sone et al. ..................... | 348/276 |
| 5,914,749 | A | 6/1999 | Bawolek et al. | |
| 5,965,875 | A | 10/1999 | Merrill | |
| 6,211,521 | B1 * | 4/2001 | Bawolek et al. ......... | 250/339.02 |
| 6,876,384 | B1 * | 4/2005 | Hubina et al. ............. | 348/223.1 |
| 7,030,916 | B2 | 4/2006 | Aotsuka | |
| 8,068,159 | B2 * | 11/2011 | Choe et al. ..................... | 348/311 |
| 2003/0058357 | A1 | 3/2003 | Aotsuka | |
| 2003/0112353 | A1 * | 6/2003 | Morris .......................... | 348/310 |
| 2003/0189656 | A1 * | 10/2003 | Shinohara ..................... | 348/272 |

(Continued)

FOREIGN PATENT DOCUMENTS

JP     6-292212     10/1994

(Continued)

OTHER PUBLICATIONS

Takahiro Saito, et al., "Image recovery for a direct color imaging approach using a color filter array", Proc. of SPIE-IS&T Electronic Imaging, SPIE vol. 6069, 606905-1-606905-11, 2006.

(Continued)

*Primary Examiner* — Sinh Tran
*Assistant Examiner* — Paul Berardesca
(74) *Attorney, Agent, or Firm* — Staas & Halsey LLP

(57) ABSTRACT

An image photographing apparatus, method and medium that can enhance color reproducibility and sensitivity. The image photographing apparatus includes a filter unit having a first filter region to pass at least one band of an incident light signal corresponding to a complementary color of a first color, and a second filter region to pass all bands of the incident light signal, wherein the first filter region and the second filter region are each formed in one of two adjacent pixels, and an image sensor unit to sense an image from the incident light signal that passes through the filter unit, the image sensor unit including a plurality of photoelectric conversion layers each having a different spectral sensitivity.

23 Claims, 15 Drawing Sheets

M: MAGENTA FILTER
Y: YELLOW FILTER
W: WHITE FILTER
W+IR_cut: WHITE FILTER CAPABLE OF BLOCKING INFRARED LIGHT

U.S. PATENT DOCUMENTS

| | | | |
|---|---|---|---|
| 2003/0209651 A1* | 11/2003 | Iwasaki | 250/214.1 |
| 2004/0178478 A1* | 9/2004 | Shizukuishi | 257/620 |
| 2006/0054987 A1 | 3/2006 | Nii | |
| 2006/0114551 A1* | 6/2006 | Okada et al. | 359/350 |
| 2006/0124833 A1 | 6/2006 | Toda | |
| 2007/0285540 A1 | 12/2007 | Kwon et al. | |
| 2011/0139969 A1 | 6/2011 | Nii | |

FOREIGN PATENT DOCUMENTS

| | | |
|---|---|---|
| JP | 11-186533 | 7/1999 |
| JP | 2001-144277 | 5/2001 |
| JP | 2002-142228 | 5/2002 |
| JP | 2003-169341 | 6/2003 |
| JP | 2004-304706 | 10/2004 |
| JP | 2006-100766 | 4/2006 |
| KR | 2001-0059228 | 7/2001 |
| KR | 10-2004-0031862 | 4/2004 |
| KR | 10-2005-0098958 | 10/2005 |

OTHER PUBLICATIONS

European Search Report for corresponding European Application No. 07115712.7 dated Sep. 28, 2010 (in English).

* cited by examiner

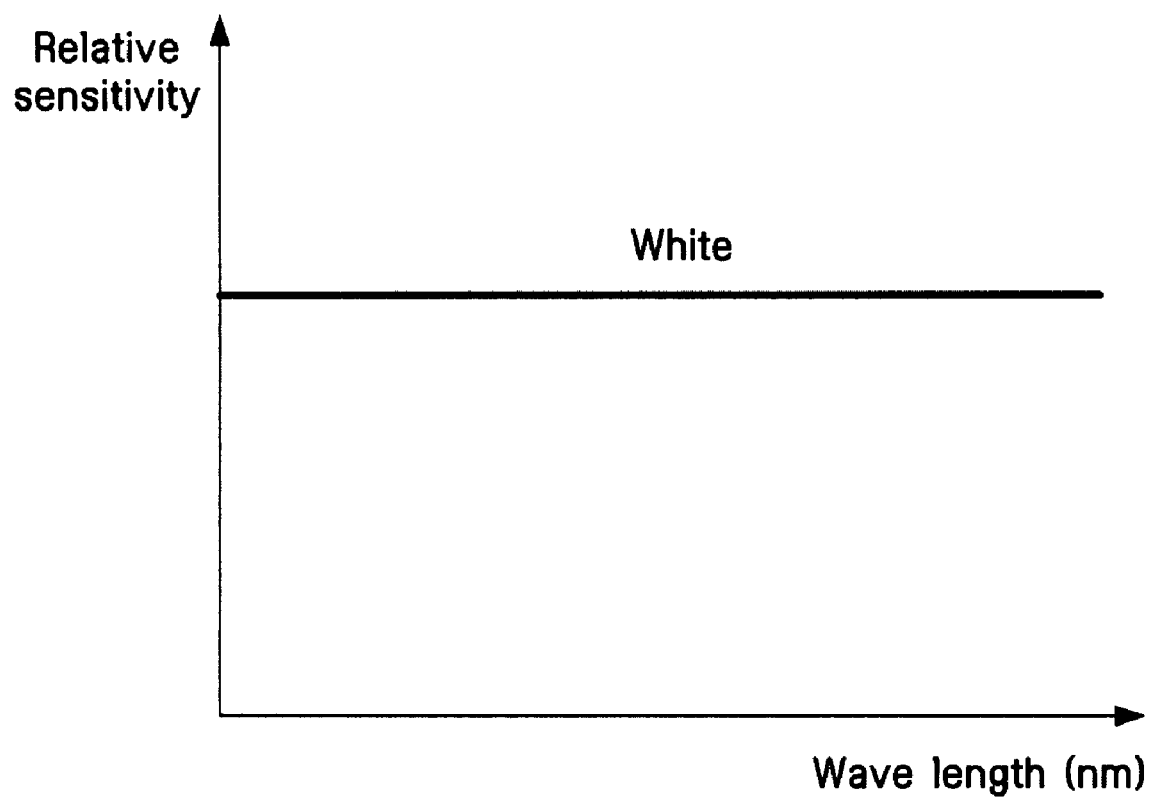

M: MAGENTA FILTER

W: WHITE FILTER

M: MAGENTA FILTER

W: WHITE FILTER

M: MAGENTA FILTER

W: WHITE FILTER

M: MAGENTA FILTER
W: WHITE FILTER

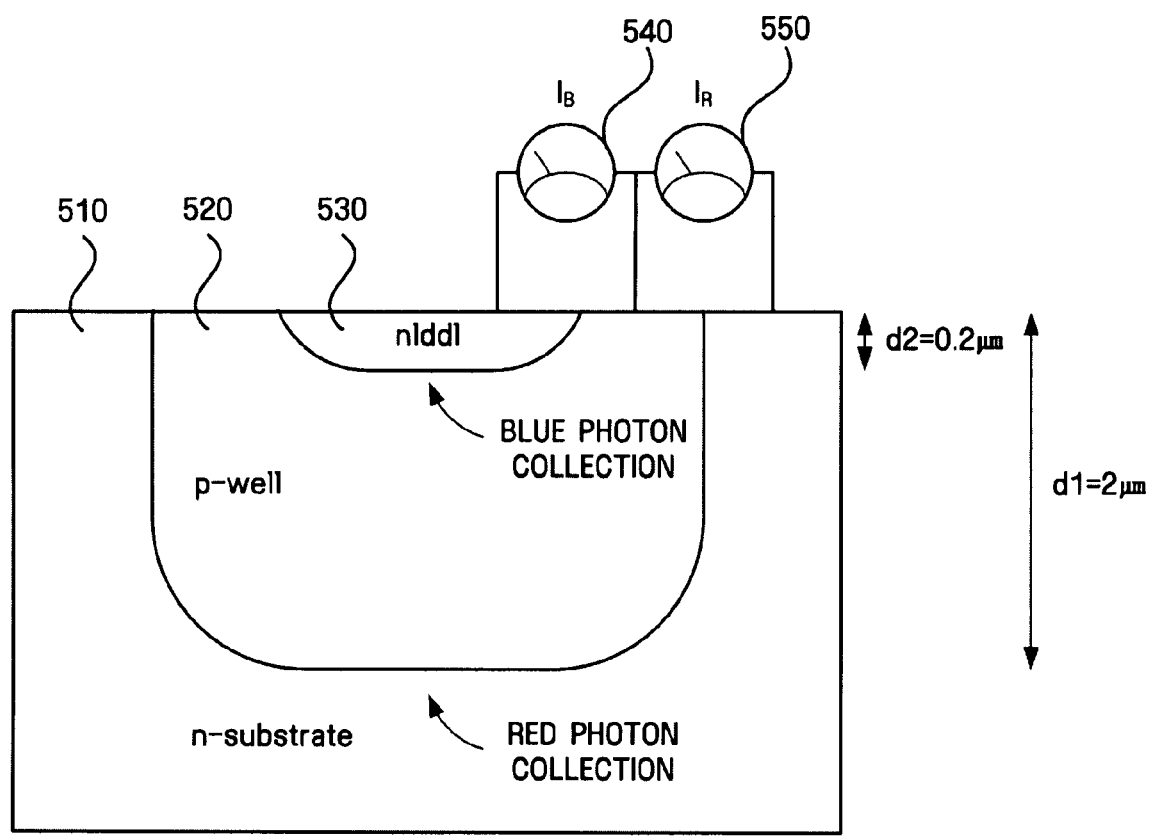

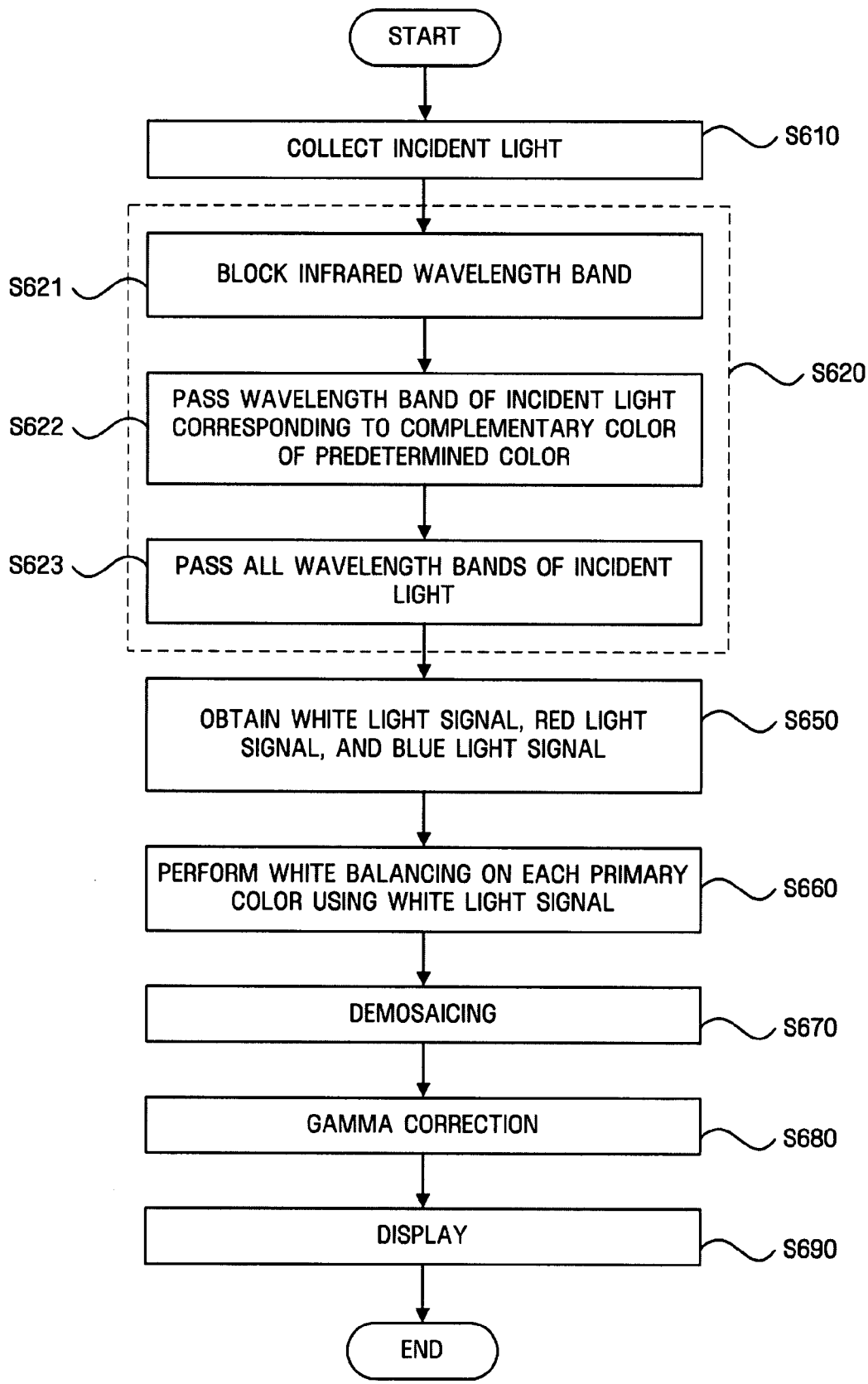

M: MAGENTA FILTER

Y: YELLOW FILTER

M: MAGENTA FILTER

Y: YELLOW FILTER

W: WHITE FILTER

M: MAGENTA FILTER

W: WHITE FILTER

W+IR_cut: WHITE FILTER CAPABLE OF BLOCKING INFRARED LIGHT

M: MAGENTA FILTER

W: WHITE FILTER

W+IR_cut: WHITE FILTER CAPABLE OF BLOCKING INFRARED LIGHT

M: MAGENTA FILTER

W: WHITE FILTER

W+IR_cut: WHITE FILTER CAPABLE OF BLOCKING INFRARED LIGHT

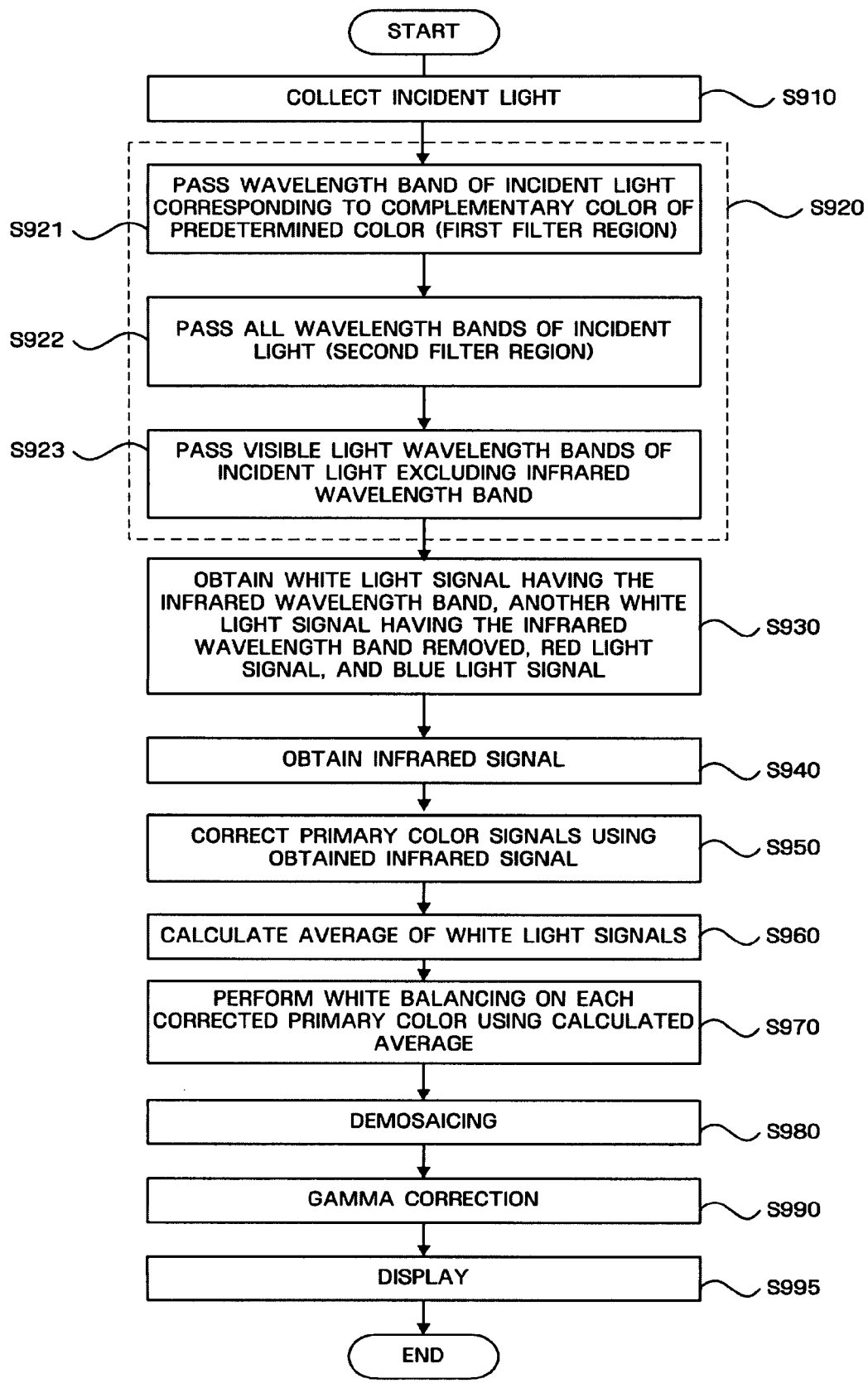

M: MAGENTA FILTER
Y: YELLOW FILTER
W: WHITE FILTER
W+IR_cut: WHITE FILTER CAPABLE OF BLOCKING INFRARED LIGHT

M: MAGENTA FILTER

Y: YELLOW FILTER

W: WHITE FILTER

W+IR_cut: WHITE FILTER CAPABLE OF BLOCKING INFRARED LIGHT

IMAGE PHOTOGRAPHING APPARATUS, METHOD AND MEDIUM WITH STACK-TYPE IMAGE SENSOR, COMPLEMENTARY COLOR FILTER, AND WHITE FILTER

CROSS-REFERENCE TO RELATED APPLICATIONS

This application claims priority from Korean Patent Application No. 10-2006-0090888 filed on Sep. 19, 2006 in the Korean Intellectual Property Office, the disclosure of which is incorporated herein by reference in its entirety.

BACKGROUND

1. Field

One or more embodiments of the present invention relate to an image photographing apparatus, method and medium, and more particularly, to an image photographing apparatus, method and medium that can enhance color reproducibility and sensitivity.

2. Description of the Related Art

Devices with built-in cameras, such as digital cameras and camera phones, are currently in widespread use.

Generally, a camera includes a lens and an image sensor. The lens collects light reflected from a subject, and the image sensor detects the light collected by the lens and converts the detected light into an electrical image signal. Image sensors are largely classified into camera tubes and solid-state image sensors. Major examples of solid-state image sensors include charge coupled devices (CCDs) and complementary metal oxide silicons (CMOSes).

In order to increase resolution of an image acquired by such a camera, a conventional technique of reducing a unit area of each pixel in a sensing region, while maintaining a total area of the sensing region has been used. In other words, if the unit area of each pixel is reduced, the number of pixels will be increased by the reduced unit area, resulting in a high-resolution image. However, while a high-resolution image can be obtained using the conventional technique, it is difficult to obtain a high-sensitivity image. This is because the amount of light reaching each pixel is reduced by the reduced unit area.

Japanese Patent Publication No. 2004-304706 describes a solid-state photographing apparatus, which arranges white filters in all directions from a green filter among green, blue, red and white filter segments, and a signal processing method used by the solid-state photographing apparatus. This conventional art relates to a technology for guaranteeing an amount of signal charge and resolution, and enhancing color reproducibility even when pixels are miniaturized. However, it fails to suggest a method for preventing a reduction in sensitivity due to the miniaturization of pixels.

In addition, U.S. Pat. No. 5,965,875 discloses a stack-type image sensor, which can extract all of red (R), green (G) and blue (B) signals from a pixel. This conventional art uses the differences in absorption depths in a silicon layer of light of different wavelengths, and detects the R, G and B signals at different depths in the silicon layer. In this case, since all of the R, G and B signals can be obtained from a pixel, resolution of an image can be enhanced. However, it is not easy to precisely separate the R, G and B signals from the silicon layer. Hence, color reproducibility deteriorates, which, in turn, makes it difficult to obtain a high-quality image.

Korean Patent Publication No. 2005-0098958 seeks to complement characteristics for G by placing a G component in a neighboring pixel. However, since the G component may still be included between R and B components in an extracted signal, color crosstalk occurs. To solve this problem, "Image Recovery for a Direct Color Imaging Approach Using a Color Filter Array" was published in the Electronic Imaging Conference held in January 2006. This conventional art is a research result of professor Takahiro Saito from Kanagawa University. In this conventional art, magenta-green filters in, for example, a Bayer pattern is simultaneously used in the stack-type image sensor disclosed in U.S. Pat. No. 5,965,875. Therefore, the deterioration of color characteristics due to crosstalk caused by photons can be compensated for by extracting narrow band B and R using the magenta filter. At the same time, G can be obtained using the G filter while B and R bands are blocked. However, a sensitivity loss of this technology is significant since its light reception sensitivity to G is reduced to ⅓ of its original sensitivity.

SUMMARY

One or more embodiments of the present invention relate to an image photographing apparatus, method and medium that can enhance color reproducibility and sensitivity.

Additional aspects and/or advantages will be set forth in part in the description which follows and, in part, will be apparent from the description, or may be learned by practice of the invention.

To achieve at least the above and/or other aspects and advantages, embodiments of the present invention include an image photographing apparatus including, a filter unit comprised of at least two combinations of a first filter region which passes a wavelength band of an incident light signal corresponding to a complementary color of a first color, a second filter region which passes a wavelength band of the incident light signal corresponding to a complementary color of a second color, and a third filter region which passes all wavelength bands of the incident light signal, and an image sensor unit to sense an image from the light signal that passes through the filter unit, wherein the image sensor unit comprises a plurality of photoelectric conversion layers each having a different spectral sensitivity.

To achieve at least the above and/or other aspects and advantages, embodiments of the present invention include a method of operating an image photographing apparatus, the method including, filtering an incident light signal using at least two combinations of a first filter region which passes a wavelength band of the incident light signal corresponding to a complementary color of a first color, a second filter region which passes a wavelength band of the incident light signal corresponding to a complementary color of a second color, and a third filter region which passes all wavelength bands of the incident light signal, receiving the filtered light signal through a plurality of photoelectric conversion layers having different spectral sensitivity, and sensing an image from the received light signal.

To achieve at least the above and/or other aspects and advantages, embodiments of the present invention include an image photographing apparatus including, a filter unit including, a first filter region to pass at least one band of an incident light signal corresponding to a complementary color of a first color, and a second filter region to pass all bands of the incident light signal, wherein the first filter region and the second filter region are each formed in one of two adjacent pixels, and an image sensor unit to sense an image from the incident light signal that passes through the filter unit, the image sensor unit including a plurality of photoelectric conversion layers each having a different spectral sensitivity.

To achieve at least the above and/or other aspects and advantages, embodiments of the present invention include a method of operating an image photographing apparatus, the method including, filtering an incident light signal using a first filter region to pass at least one band of the incident light signal corresponding to a complementary color of a first color, using a second filter region to pass all wavelength bands of the incident light signal and using a third filter region to block an infrared band, receiving the filtered light signal through a plurality of photoelectric conversion layers each having a different spectral sensitivity, and sensing an image from the received light signal.

BRIEF DESCRIPTION OF THE DRAWINGS

These and/or other aspects and advantages will become apparent and more readily appreciated from the following description of the embodiments, taken in conjunction with the accompanying drawings of which

FIG. 3 illustrates a spectrum of a light signal that passes through a second filter region of the filter unit of FIG. 1;

FIG. 5 is a cross-sectional view of a unit pixel that forms an image sensor unit of FIG. 1;

FIG. 6 illustrates a method of operating the image photographing apparatus of FIG. 1;

FIG. 11 illustrate a method of operating the image photographing apparatus of FIG. 9.

DETAILED DESCRIPTION OF EMBODIMENTS

Figure 1:
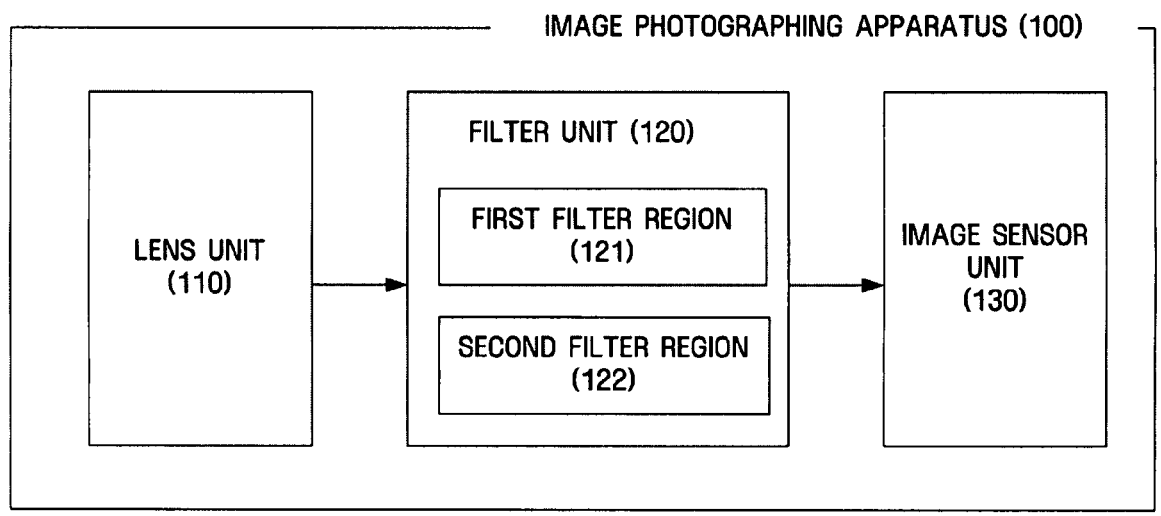
FIG. 1 illustrates an image photographing apparatus, according to an embodiment of the present invention.

Reference will now be made in detail to embodiments, examples of which are illustrated in the accompanying drawings, wherein like reference numerals refer to the like elements throughout. Embodiments are described below to explain the present invention by referring to the figures.

In embodiments of the present invention, an image photographing apparatus may refer to an apparatus which can store an image of a subject using a solid-state image sensor such as a charge coupled device (CCD) or a complementary metal oxide semiconductor (CMOS). Examples of the image photographing apparatus include, for example, a digital camera, a digital camcorder, a camera phone, and a personal digital assistant (PDA). An image photographing apparatus, according to an embodiment of the present invention, will now be described in more detail with reference to FIG. 1.

FIG. 1 illustrates an image photographing apparatus 100 according to an embodiment of the present invention. Referring to FIG. 1, the image photographing apparatus 100 may include, for example, a lens unit 110, a filter unit 120, and an image sensor unit 130.

The lens unit 110 may include, for example, one or more lenses collecting incident light. The number of lenses may vary according to purpose and need. In addition, the lenses may be arranged in various forms on the same plane. For example, the lenses may be arranged in a row or column or in a matrix having rows×columns.

The filter unit 120 may filter the light collected by the lens unit 110. In other words, the filter unit 120 may pass light having a predetermined wavelength band from the light collected by the lens unit 110. Specifically, the filter unit 120, according to an embodiment may include, for example, a first filter region 121 and a second filter region 122.

Figure 2:
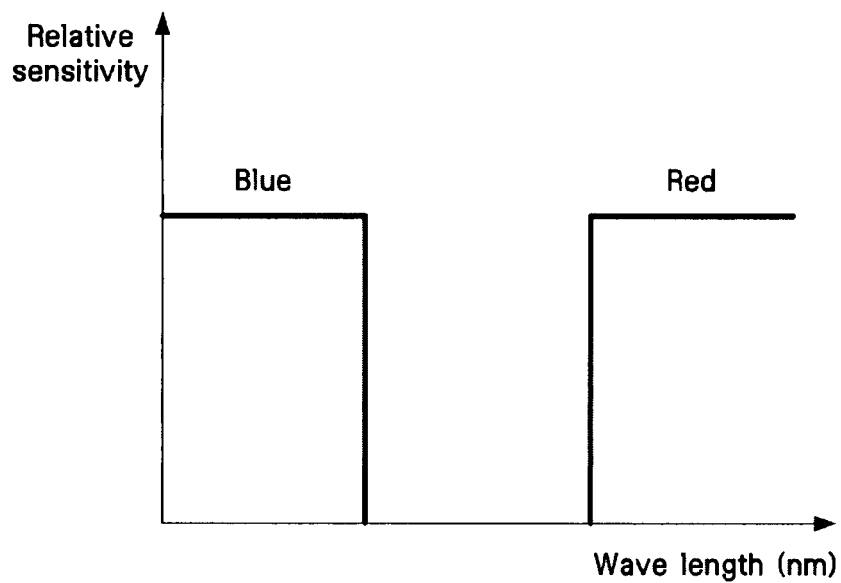
FIG. 2 illustrates a spectrum of a light signal that passes through a first filter region of a filter unit of FIG. 1.

The first filter region 121 may pass a wavelength band of the light collected by the lens unit 110 and corresponding to a predetermined complementary color. To this end, the first filter region 121 may be formed of a complementary filter of a predetermined color. Specifically, the first filter region 121 may be formed of any one of a cyan filter, which is a complementary color filter of red, a magenta filter, which is a complementary color filter of green, and a yellow filter which is a complementary color filter of blue. For example, if the first filter region 121 is formed using the cyan filter, the first filter region 121 may pass a green wavelength band and a blue wavelength band of the light collected by the lens unit 110. If the first filter region 121 is formed of the magenta filter, the first filter region 121 may pass a red wavelength band and a blue wavelength band of the light collected by the lens unit 110. If the first filter region 121 is formed of the yellow filter, the first filter region 121 may pass a red wavelength band and a green wavelength band of the light collected by the lens unit 110. Hereinafter, a case where the first filter region 121 is formed of the magenta filter will be described as an example. FIG. 2 illustrates a spectrum of a light signal that passes through the first filter region 121 when the first filter region 121 is formed of the magenta filter. Referring to FIG. 2, the light signal that passes through the first filter region 121 includes a blue light signal and a red light signal, and excludes a green light signal.

Next, the second filter region 122 may pass all wavelengths of the light collected by the lens unit 110. To this end, no filter may be formed in the second filter region 122. In another embodiment of the present invention, the second filter region 122 may be formed of a white filter, i.e., a colorless filter. Hereinafter, a case where the second filter region 122 is formed of the white filter will be described as an example.

FIG. 3 illustrates a spectrum of a light signal that passes through the second filter region 122 when the second filter region 122 is formed with a white filter. Referring to FIG. 3, the light signal that passes through the second filter region 122 typically includes light signals of all wavelengths. In other words, the amount of light reaching pixels located at a position corresponding to the second filter region 122 may be greater than that of light reaching pixels located at a position corresponding to the first filter region 121. Therefore, the number of effective pixels included in a complementary metal oxide semiconductor image sensor (CIS) of a limited size may be increased. Consequently, a reduction in the amount of light reaching each pixel may be prevented even when a unit area of each pixel is reduced.

Figure 4A:
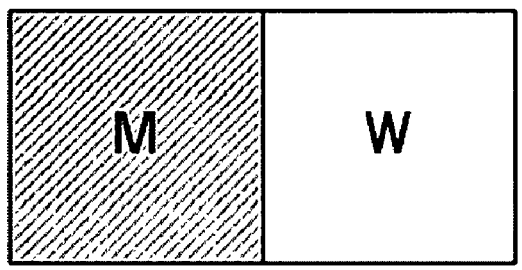
FIGS. 4A through 4D illustrate the filter unit of FIG. 1, according to an embodiment of the present invention.
Figure 4B:
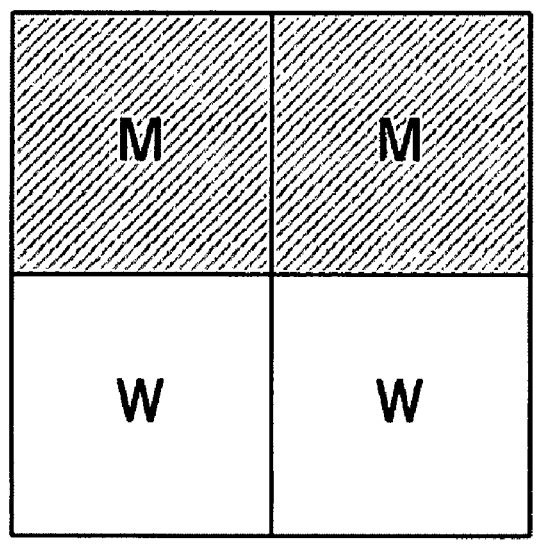
Figure 4C:
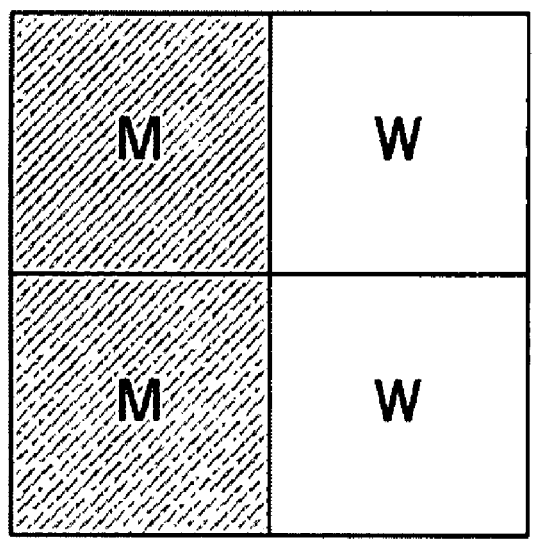
Figure 4D:
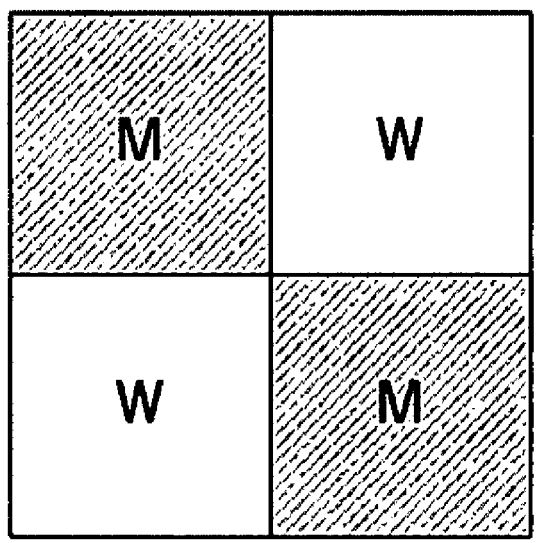

According to an embodiment of the present invention, each filter included in the filter region 120 may be formed in units of pixels. In other words, referring to FIG. 4A, in a basic structure composed of two adjacent pixels, a complementary color filter may be formed in one of the two adjacent pixels, and a white filter may be formed in the other pixel. In this case, the complementary color filter and the white filter may be arranged in various forms. That is, the arrangement of the complementary color filter and the white filter may be expanded and modified using the two adjacent filters illustrated in FIG. 4A as a basic structure. FIGS. 4B through 4D illustrate examples of the arrangement of a complementary filter and a white filter.

Referring to FIG. 4B, a complementary color filter, e.g., a magenta filter, is formed at positions corresponding to odd-numbered rows of pixels, among a plurality of pixels arranged in a matrix form, and a white filter is formed at positions corresponding to even-numbered rows of pixels. Referring to FIG. 4C, the complementary filter may be formed at positions corresponding to odd-numbered columns of pixels, and the white filter may be formed at positions corresponding to even-numbered columns of pixels. Referring to FIG. 4D, the complementary color filter and the white filter may be formed diagonally opposite each other.

In addition to the complementary color filter and the white filter, the filter unit 120 may selectively include an infrared filter filtering out light of a predetermined wavelength band, for example, infrared light, from the light collected by the lens unit 110. The infrared filter may be used in order to prevent the infrared light from damaging image information in a visible light region. Specifically, a solid-state image sensor generally is highly sensitive to infrared light as well as visible light. The infrared light reaching the solid-state image sensor may cause image blurring, discoloration, and fogging. Hence, if the infrared light is blocked using the infrared filter, the damage to the image information in the visible light region caused by the infrared light may be prevented. The infrared filter may be formed across an entire filter layer that may include the complementary filter of the first filter region 121 and the white filter of the second filter region 122. Here, the infrared filter may be separated a predetermined distance from the filter layer or may be closely attached to the filter layer. If the infrared filter is formed across the entire filter layer, a light signal that passes through the first filter 121 may have a spectrum having an infrared wavelength band removed from the spectrum illustrated in FIG. 2. In addition, a light signal that passes through the second filter region 122 may have a spectrum having the infrared wavelength band removed from the spectrum illustrated in FIG. 3.

Referring back to FIG. 1, the image sensor unit 130 may sense a light signal that passes through the filter unit 120 and may generate an image. The image sensor unit 130 may include, for example, a plurality of pixels. The image sensor unit 130 will now be described in more detail with reference to FIG. 5.

FIG. 5 is a cross-sectional view of a unit pixel that forms the image sensor unit 130. Referring to FIG. 5, the image sensor unit 130 may include, for example, a first photoelectric conversion layer and a second photoelectric conversion layer.

The first photoelectric conversion layer may convert light having a long wavelength and transmission distance, e.g., a red light signal, in a light signal that passes through the first filter region 121, into an electrical signal. The first photoelectric conversion layer may include an amorphous silicon layer 510 doped with impurities of a first conductivity type and an amorphous silicon layer 520 doped with impurities of a second conductivity type, which are stacked sequentially. Specifically, the first photoelectric conversion layer may include the amorphous silicon layer 510 doped with n-type impurities and the amorphous silicon layer 520 doped with p-type impurities, which are stacked sequentially. Here, a p-n junction may be located at a depth of d1, which is approximately 2 μm down from a top surface of a substrate. The p-n junction may form a red photodiode.

The second photoelectric conversion layer may convert light having a short wavelength and transmission distance, e.g., a blue light signal, in the light signal that passes through the first filter region 121, into an electrical signal. The second photoelectric conversion layer may include a silicon layer 520 doped with impurities of the second conductivity type and an amorphous silicon layer 530 doped with impurities of the first conductivity type, which are stacked sequentially. Specifically, the second photoelectric conversion layer may include the silicon layer 520 doped with p-type impurities and the amorphous silicon layer 530 doped with n-type impurities, which are stacked sequentially. Here, a p-n junction may be located at a depth of d2, which may be approximately 0.2 μm down from the top surface of the substrate. The p-n junction may form a blue photodiode.

The image sensor unit 130 may also include, for example, a measurement unit 540 measuring photocurrent due to red light, another measurement unit 550 measuring photocurrent due to blue light, and a conductive structure (not shown) outputting signals detected from the first and second photoelectric conversion layers, respectively. Furthermore, a complementary color filter may be formed on the pixel illustrated in FIG. 5 at a position corresponding to a pixel region.

The image sensor unit 130 may obtain a white light signal $I_W$ from a light signal that passes through the second filter region 122. In addition, the image sensor unit 130 may obtain a red light signal $I_R$ and a blue light signal $I_B$ from the light signal that passes through the first filter region 121. Specifically, the image sensor unit 130 may obtain the red light signal $I_R$ from the first photoelectric conversion layer and obtain the blue light signal $I_B$ from the second photoelectric conversion layer.

Once the white light signal $I_W$, the red light signal $I_R$, and the blue light signal $I_B$ are obtained, the image sensor unit 130 may perform white balancing on the red light signal $I_R$ and the blue light signal $I_B$ based on the obtained white light signal $I_W$. Then, the image sensor unit 130 may perform demosaicing on each of a white-balanced red light signal $I_R'$ and a white-balanced blue light signal $I_B'$. Demosaicing denotes restoring color information that a pixel lacks using color information found in the pixel and its adjacent pixels. The image sensor unit 130 may generate a demosaiced red light signal $I_R''$ and a demosaiced blue light signal $I_B''$ after the demosaicing operation.

The image sensor unit 130 may simplify the conversion from a red (R), green (G) and blue (B) signal, which is a primary color signal, to an YCrCb signal, which is a color difference signal, based on the red light signal $I_R$, the blue light signal $I_B$ and the white light signal $I_W$ obtained as described above. Generally, the relationship between the primary color signal and the color difference signal may be defined by Equation 1 below.

$$Y = aR + bG + cB$$

$$Cr = R - Y$$

$$Cb = B - Y \qquad \text{Equation 1}$$

In Equation (1), luminance Y may be regarded as being identical to the white light signal $I_W$. In addition, R may be regarded as being identical to the demosaiced red light signal $I_R''$, and B may be regarded as being identical to the demosaiced blue light signal $I_B''$. Therefore, the relationship between the primary color signal and the color difference signal may also be defined by Equation 2 below.

$$Y = I_W$$

$$Cr = I_R' - I_W$$

$$Cb = I_B' - I_W \qquad \text{Equation 2}$$

When the white signal $I_W$ is regarded as being identical to the luminance Y as in Equation 2, the conversion from the primary color signal into the color difference signal may be simpler than when the conversion is performed using all of the red light signal, the green light signal and the blue light signal as in Equation 1 above. In addition, it may be understood from Equation 2 that the primary color signal can be converted into the color difference signal without using a green filter.

FIG. 6 illustrates an image photographic method, for example, a method of operating the image photographing apparatus 100 of FIG. 1, although other apparatuses may be equally used.

When a light signal reflected from a subject is incident, e.g., on the lens unit 110, the incident light signal may be collected in operation S610, e.g., by the lens unit 110.

Then, the collected light signal may be filtered in operation S620, e.g., by the filter unit 120. Operation S620 may include, for example, operation S621 in which the infrared filter of the filter unit 120 may filter out a light signal having an infrared wavelength band from the light signal collected by the lens unit 110, operation S622 in which the first filter region 121 of the filter unit 120 may pass a light signal having a wavelength band corresponding to a predetermined complementary color in the light signal without the infrared wavelength band, and operation S623 in which the second filter region 122 may pass all wavelength bands of the light signal without the infrared wavelength band. Here, if the first filter region 121 is formed of the magenta filter, a light signal that passes though the first filter region may include a red light signal and a blue light signal, and may exclude a green light signal. In addition, a light signal that passes through the second filter region 122 may include signals of all visible light wavelength bands, excluding the infrared wavelength band.

An example in which operations S621 through S623 are sequentially performed has been described above. However, this is merely an example used to promote the understanding of embodiments of the present invention, and the present invention is not limited thereto. In other words, operations S621 through S623 may be performed sequentially as described, simultaneously, or in any order. If necessary, one or more of operations S621 through S623 may also be removed, as would be apparent to one skilled in the art.

If the filter unit 120 filters the light signal collected by the lens unit 110, the image sensor unit 130 may sense the light signal that passes through the filter unit 120 and generate an image. In other words, the image sensor unit 130 may obtain a red light signal $I_R$ and a blue light signal $I_B$ from the light signal that passes through the first filter region 121 and may obtain a white light signal $I_W$ from a light signal that passes through the second filter region 122 in operation S650. Here, the red light signal $I_R$ may be obtained from the first photoelectric conversion layer, and the blue light signal $I_B$ may be obtained from the second photoelectric conversion layer.

Once the red light signal $I_R$, the blue light signal $I_B$, and the white light signal $I_W$ are obtained, the image sensor unit 130 may perform white balancing on the red light signal $I_R$ and the blue light signal $I_B$ based on the obtained white light signal $I_W$ in operation S660.

Next, demosaicing may be performed on each of a white-balanced red light signal $I_R'$ and a white-balanced blue light signal $I_B'$ in operation S670, e.g., by the image sensor unit 130. Then, the image sensor unit 130 may generate an image in a predetermined signal format, for example, a YCbCr format, based on a demosaiced red light signal $I_R''$, a demosaiced blue light signal $I_B''$, and the white light signal $I_W$.

The image generated by the image sensor unit 130 may be gamma-corrected in operation S680, and the gamma-corrected image may be displayed on a predetermined display module (not shown) in operation S690.

In one or more embodiments, the image photographing apparatus 100 may include the first filter region 121 in which a complementary color filter is formed, and the second filter region 122 in which a white filter is formed. However, embodiments of the present invention are not limited thereto and may be modified in various forms.

Figure 7:
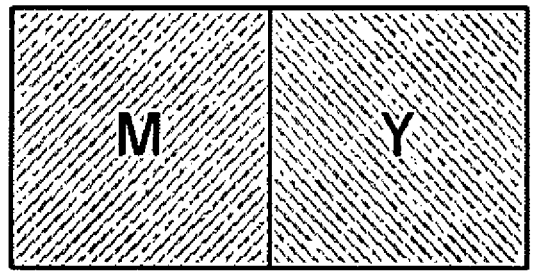
FIG. 7 illustrates the filter unit of FIG. 1, according to an embodiment of the present invention.

For example, a first complementary color filter may be formed in the first filter region 121, and a second complementary color filter, instead of the white filter, may be formed in the second filter region 122. Specifically, referring to FIG. 7, in a basic structure composed of two adjacent pixels, a magenta filter may be formed in one of the two adjacent pixels, and a yellow filter may be formed in the other pixel. Here, the magenta filter and the yellow filter may be arranged in various forms. For example, the magenta filter may be formed at positions corresponding to odd-numbered rows of pixels, and the yellow filter may be formed at positions corresponding to even-numbered rows of pixels. Alternatively, the magenta filter may be formed at positions corresponding to odd-numbered columns of pixels, and the yellow filter may be formed at positions corresponding to even-numbered columns of pixels. In addition, the magenta filter and the yellow filter may be formed diagonally opposite each other.

Figure 8:
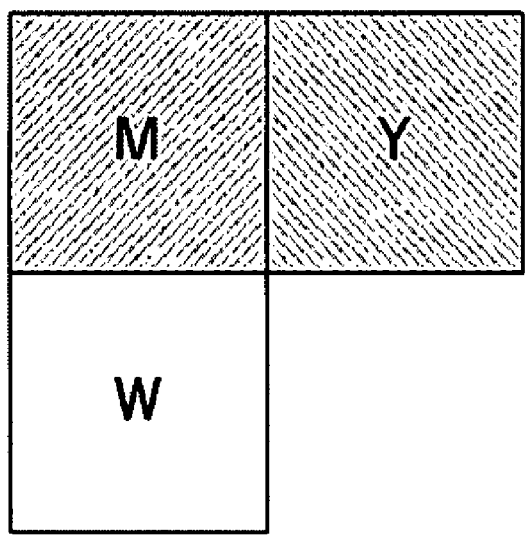
FIG. 8 illustrates the filter unit of FIG. 1, according to an embodiment of the present invention.

In another example, the first filter region 121 may include a first sub-filter region and a second sub-filter region. Here, the first complementary color filter may be formed in the first sub-filter region, and the second complementary color filter may be formed in the second sub-filter region. In addition, a white filter may be formed in the second filter region 122. Specifically, in a basic structure composed of three adjacent pixels as illustrated in FIG. 8, a magenta filter may be formed in one of the three adjacent pixels, a yellow filter may be formed in another pixel, and a white filter may be formed in the remaining pixel.

In one or more embodiments the image photographing apparatus 100 may have the infrared filter formed across the entire filter layer, including the complementary color filter of the first filter region 121 and the white filter of the second filter region 122, as described above. Hereinafter, an image photographing apparatus 700 including, for example, a white filter and another white filter that can filter out infrared light in a second filter region will be described with reference to FIG. 9.

Figure 9:
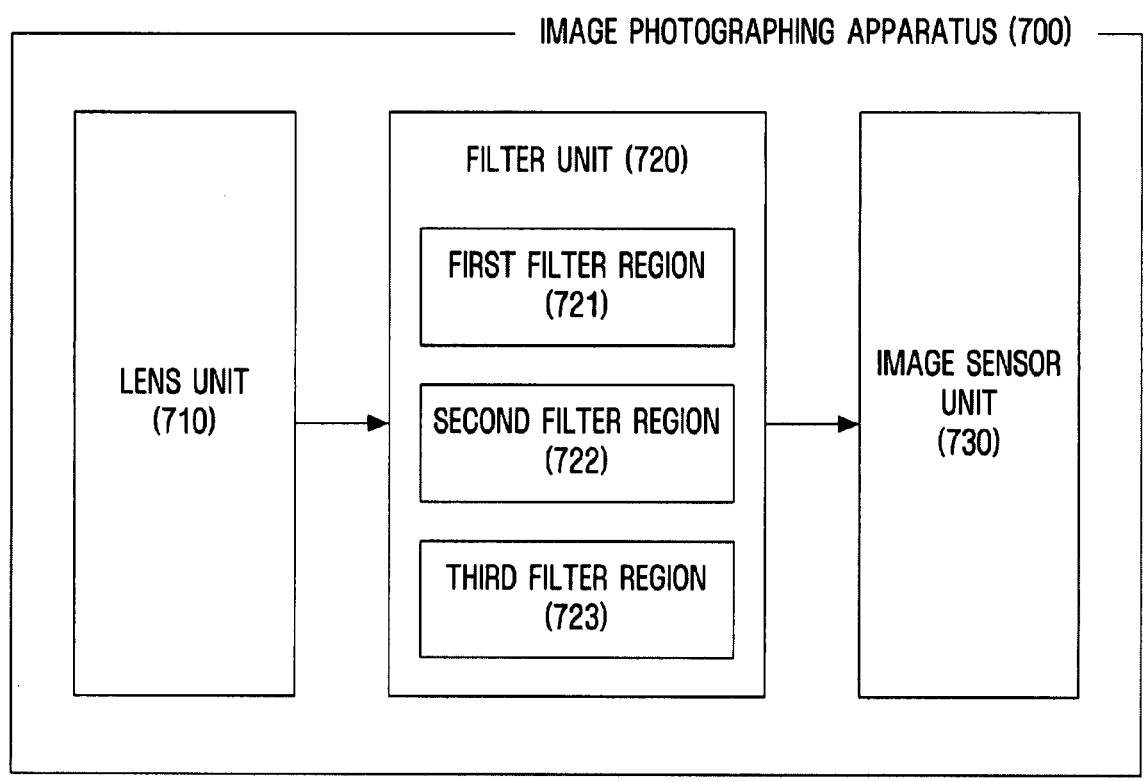
FIG. 9 illustrates an image photographing apparatus, according to an embodiment of the present invention.

Since a lens unit 710 illustrated in FIG. 9 may be identical to the lens unit 110 illustrated in FIG. 1, a detailed description thereof will be omitted. Accordingly, the description of the present embodiment will be focused on the operations of a filter unit 720 and an image sensor unit 730.

The filter unit 720 filters light, e.g., light collected by the lens unit 710. Specifically, the filter unit 720 may include, for example, a first filter region 721, a second filter region 722, and a third filter region 723.

The first filter region 721 may pass a wavelength band of the light collected by the lens unit 710 corresponding to a predetermined complementary color. To this end, the first filter region 721 may be formed of a complementary color filter of a predetermined color. For example, the first filter region 721 may be formed of any one of, for example, a cyan filter, a magenta filter, and a yellow filter. Hereinafter, an example where the first filter region 721 is formed of a magenta filter will be described as an example. The magenta filter typically blocks a green wavelength band of light incident on the first filter region 721 and passes a red wavelength band and a blue wavelength band of the incident light.

The second filter region 722 may pass all wavelength bands of the light collected by the lens unit 710. To this end, the second filter region 722 may be formed of a white filter. In another example, no additional filter may be formed in the second filter region 722. Hereinafter, a case where the white filter is formed in the second filter region 722 will be described as an example.

The third filter region 723 may be formed of a white filter (hereinafter referred to as an infrared filter) blocking an infrared wavelength band of incident light.

Figure 10A:
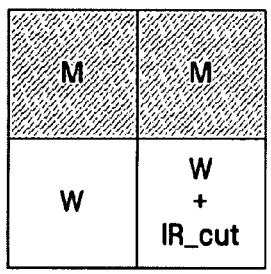
FIGS. 10A through 10C illustrate a filter unit of FIG. 9, according to an embodiment of the present invention.
Figure 10B:
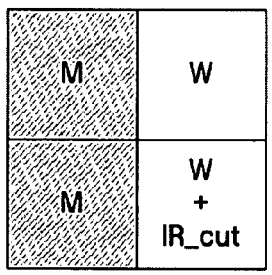
Figure 10C:
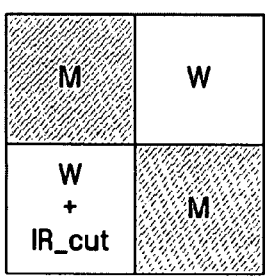

Each of the complementary color filter, the white filter, and the infrared filter may be formed in units of pixels. In other words, any one of the complementary color filter, the white filter, and the infrared filter may be formed on a pixel. In this case, each filter may be arranged in various forms. FIGS. 10A through 10C illustrate the arrangement of a complementary color filter, a white filter and an infrared filter according to embodiments of the present invention.

Referring to FIG. 10A, the complementary color filter may be formed in an odd-numbered row, and the white filter and the infrared filter may be arranged adjacent to each other in an even-numbered row. Referring to FIG. 10B, the complementary color filter may be formed in an odd-numbered column, and the white filter and the infrared filter may be arranged adjacent to each other in an even-numbered column. Referring to FIG. 10C, the white filter and the infrared filter may be arranged in a diagonal direction, and the complementary color filter may also arranged in a diagonal direction.

Referring back to FIG. 9, the image sensor unit 730 may sense the light that passes through the filter unit 720 and generate an image. The image sensor unit 730 may include a plurality of pixels. Since the structure of each pixel is identical to the structure described above with reference to FIG. 5, a detailed description thereof will be omitted.

The image sensor unit 730 may obtain a red light signal $I_R$ and a blue light signal $I_B$ from light that passes through the first filter region 721. In this case, the red light signal $I_R$ may be obtained from a first photoelectric conversion layer, and the blue light signal $I_B$ may be obtained from a second photoelectric conversion layer. In addition, the image sensor unit 730 may obtain a white light signal $I_{WTR}$ having an infrared wavelength band from light that passes through the second filter region 722 and may obtain a white light signal $I_W$ without the infrared wavelength band from light that passes through the third filter region 723.

Then, the image sensor unit 730 may subtract the white light signal $I_W$ that passes through the third filter region 723 from the white light signal $I_{WTR}$ that passes through the second filter region 722 using Equation (3) below and may obtain an infrared signal $I_{IR}$.

$$I_{IR}=I_{WTR}-I_W \qquad \text{Equation 3}$$

Once the infrared signal $I_{IR}$ is obtained, the image sensor unit 730 may subtract the infrared signal $I_{IR}$ from the red light signal $I_R$ and subtract the infrared signal $I_{IR}$ from the blue light signal $I_B$. In so doing, the image sensor unit 730 may correct the red light signal $I_R$ and the blue light signal $I_B$ as shown, for example, in Equation (4) below. In Equation (4), $I_R'$ indicates a corrected red light signal, and $I_B'$ indicates a corrected blue light signal.

$$I_R'=I_R-I_{IR}$$

$$I_B'=I_B-I_{IR}. \qquad \text{Equation 4}$$

If the corrected red light signal and the corrected blue light signal are obtained, the image sensor unit 730 may obtain an average white light signal of the white light signal $I_{WTR}$ having the infrared wavelength band and the white light signal $I_W$ having the infrared wavelength band removed. Here, the image sensor unit 730 may obtain the average white light signal according to an illuminance state. For example, the image sensor unit 730 may divide the illuminance state into a high-illuminance state and a low-illuminance state, and obtain the average white light signal using an equation corresponding to the high-illuminance state or the low-illuminance state.

In the high-illuminance state, for example, the image sensor unit 730 may subtract the infrared signal $I_{IR}$ from the white light signal $I_{WTR}$ having the infrared wavelength band. Then, the image sensor unit 730 may add the white light signal $I_W$ without the infrared wavelength band to the subtraction result and divide the addition result by 2. Consequently, the image sensor unit 730 may obtain an average white light signal $I_W'$ of the white light signals $I_{IR}$ and $I_{WTR}$ as shown in Equation (5) below.

$$I_W'=(I_{WTR}-I_{IR}+I_W)/2. \qquad \text{Equation 5}$$

On the other hand, the contours of a subject may not be as clear in the low-illuminance state as in the high-illuminance state. Therefore, unlike in the high-illuminance state, in the low-illuminance state, the image sensor unit 730 may obtain the average white light signal $I_W'$ without removing the infrared signal $I_{IR}$. Specifically, the image sensor unit 730 may add the white light signal $I_W$ having the infrared wavelength band removed and the infrared signal $I_{IR}$ to the white light signal $I_{WTR}$ having the infrared wavelength band and divide the addition result by 2. Consequently, the image sensor unit 730 may obtain the average white light signal $I_W'$ of the white light signals $I_{IR}$ and $I_{WTR}$ as shown in Equation (6) below.

$$I_W'=(I_{WTR}+I_W+I_{IR})/2 \qquad \text{Equation 6}$$

If the average white light signal $I_W'$ is obtained, for example, using Equation (5) or (6), the image sensor unit 730 may perform white balancing on the corrected red light signal $I_R'$ and the corrected blue light signal $I_B'$ based on the average white light signal $I_W'$.

In addition, the image sensor unit 730 may perform demosaicing on each of the white-balanced red light signal $I_R''$ and the white-balanced blue light signal $I_B'$.

If the average white light signal $I_W'$, a demosaiced red light signal $I_R''$ and a demosaiced blue light signal $I_B''$ are obtained, the image sensor unit 730 may generate an image in an YCbCr format, which is a color difference signal, based on the obtained signals as in Equation (7) below.

$$Y=I_W'$$

$$Cr=I_R''-I_W'$$

$$Cb=I_B''-I_W' \qquad \text{Equation 7}$$

Equation (7) may be obtained from Equation (1), for example. As described above, the relationship between the RGB signal, which is the primary color signal, and the YCbCr signal, which is the color difference signal, may generally be defined by Equation (1). However, since the average white light signal $I_W'$ obtained using Equation (5) or (6) is the luminance Y, the demosaiced red light signal $I_R''$ is R, and the demosaiced blue light signal $I_B''$ is B in Equation (1), the format of the color difference signal may be defined, for example, by Equation (7).

FIG. 11 illustrates a method of operating the image photographing apparatus 700 of FIG. 9.

When light reflected from a subject is incident, e.g., on the lens unit 710, the incident light may be collected in operation S910, e.g., by the lens unit 710.

Then, the collected light may be filtered in operation S920, e.g., by the filter unit 720. Operation S920 may include, for example, operation S921 in which the first filter region 721 may pass a light signal having a wavelength band corresponding to a predetermined complementary color in the light collected by the lens unit 710, operation S922 in which the second filter region 722 passes all wavelength bands of the collected light, and operation S923 in which all wavelength bands of the collected light, excluding an infrared wavelength band are passed. Operations S921 through S923 may be performed sequentially as described, simultaneously, or in any order.

The image sensor unit 730 may sense light that passes through each of the first through third filter regions 721 through 723 and obtain a white light signal having the infrared wavelength band, another white light signal having the infrared wavelength band removed, and a primary color signal in operation S930. Here, the primary color signal may vary according to the type of a complementary color filter that forms the first filter region 721. For example, if the complementary color filter is a magenta filter, the image sensor unit 730 may obtain a red light signal from the first photoelectric conversion layer and a blue light signal from the second photoelectric conversion layer.

Thereafter, an infrared signal may be obtained using Equation (3) in operation S940, e.g. by the image sensor unit 730. Then, the primary color signal may be corrected based on the obtained infrared signal in operation S950, e.g., by the image sensor unit 730. For example, as in Equation (4), the image sensor unit 730 may correct the red light signal by removing the infrared signal from the red light signal. In addition, the image sensor unit 730 may correct the blue light signal by removing the infrared signal from the blue light signal.

Next, the image sensor unit 730 may calculate an average of white light signals based on a light signal that passes through the white filter and a light signal that passes through the infrared filter in operation S960. For example, as shown in Equation (5), the image sensor unit 730 may subtract the infrared signal from the light signal that passes through the white filter and the light signal that passes through the infrared filter and divide the subtraction result by 2 to calculate the average of the white light signals.

The image sensor unit 730 may perform white balancing on the corrected red light signal and the corrected blue light signal based on the average of the white light signals calculated in operation S960, in operation S970. Then, the image sensor unit 730 may perform demosaicing on each of the white-balanced red light signal and the white-balanced blue light signal in operation S980.

An image obtained after the demosaicing operation may be gamma-corrected in operation S990 and displayed on a predetermined display module in operation S995.

In the above embodiment, the image photographing apparatus 700 including the first filter region 721 in which the complementary color filter is formed, the second filter region 722 in which the white filter is formed, and the third filter region 723 in which the infrared filter is formed has been described. However, the present invention is not limited thereto and may be modified in various forms.

Figure 12A:
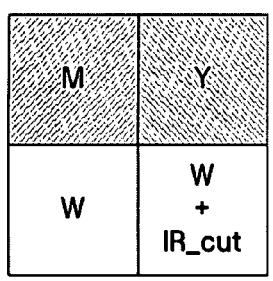
FIGS. 12A and 12B illustrate the filter unit of FIG. 9, according to an embodiment of the present invention.
Figure 12B:
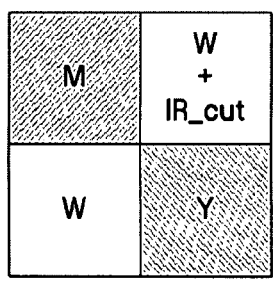

For example, the first filter region 721 may include a first sub-filter region and a second sub-filter region. A first complementary color filter may be formed in the first sub-filter region, and a second complementary color filter may be formed in the second sub-filter region. In addition, a white filter may be formed in the second filter region 722, and an infrared filter may be formed in the third sub-filter region 723. Here, as illustrated in FIG. 12A, the first complementary color filter and the second complementary color filter may be arranged parallel to each other in the same direction, and the white filter and the infrared filter may be arranged parallel to each other in the same direction. Alternatively, as illustrated in FIG. 12B, the first complementary color filter and the second complementary color filter may face each other in a first diagonal direction, and the white filter and the infrared filter may face each other in a second diagonal direction.

As described above, an image photographing apparatus, method and medium, according to embodiments of the present invention provide at least one of the following advantages.

First, any one of three primary color signals may be blocked using a complementary color filter. Consequently, the other two primary color signals may be more precisely separated from a signal sensed by an image sensor, thereby enhancing color reproducibility.

Since the image sensor may use a complementary color filter, it may obtain an image with higher resolution than that of an image obtained by an image sensor using a Bayer pattern color filter. In addition, a manufacturing process may be simplified.

The amount of light reaching a pixel may be increased using a white filter, which, in turn, may increase sensitivity.

Since an image may be generated using primary color signals extracted from a light signal that passes through a complementary color filter and a luminance signal extracted from a light signal that passes through a white filter, signal processing may be simplified.

An image photographing apparatus, method and medium, according to embodiments of the present invention have been described with reference to block diagrams or flowchart illustrations. It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus, such that the instructions, which execute via the processor of the computer or other programmable data processing apparatus, implement processes specified in the flowchart block or blocks.

These computer program instructions may also be stored in a computer usable or computer-readable memory that can direct a computer or other programmable data processing apparatus to function in a particular manner, such that the instructions stored in the computer usable or computer-readable memory produce an article of manufacture including instructions that implement the function specified in the flowchart block or blocks.

The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the processes specified in the flowchart block or blocks.

And each block of the flowchart illustrations may represent a module, segment, or portion of code, which comprises one or more executable instructions for implementing the specified logical function(s). It should also be noted that in some alternative implementations, the functions noted in the blocks may occur out of the prescribed order. For example, two blocks shown in succession may in fact be executed substantially concurrently, or the blocks may sometimes be executed in the reverse order, depending upon the functionality involved.

The term "unit", as used herein, may mean, but is not limited to, a software or hardware component, such as a Field Programmable Gate Array (FPGA) or Application Specific Integrated Circuit (ASIC), which performs certain tasks. A unit may advantageously be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units.

In addition to the above described embodiments, embodiments of the present invention may also be implemented through computer readable code/instructions in/on a medium, e.g., a computer readable medium, to control at least one processing element to implement any above described embodiment. The medium can correspond to any medium/media permitting the storing and/or transmission of the computer readable code.

The computer readable code may be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as carrier waves, as well as through the Internet, for example. Thus, the medium may further be a signal, such as a resultant signal or bitstream, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An image photographing apparatus comprising:
    a filter unit comprising:
        a first filter region comprising:
            a first sub-filter region which passes a first wavelength band of an incident light signal corresponding to a complementary color of a first color; and
            a second sub-filter region which passes a second wavelength band of the incident light signal corresponding to a complementary color of a second color;
        a second filter region which passes all wavelength bands of the incident light signal; and
        a third filter region including a white filter which blocks an infrared wavelength band of the incident light signal; and
    an image sensor unit to sense an image from the light signal that passes through the filter unit,
    wherein each of the first sub-filter region and the second sub-filter region is formed of any one of a cyan filter, a magenta filter, and a yellow filter with a filter of the first sub-filter region being different than a filter of the second sub-filter region, and
    wherein the first sub-filter region and the second sub-filter region are formed adjacent to each other in a first row and the second filter region and the third filter region are formed adjacent to each other in a second row that is consecutive to the first row.

2. The apparatus of claim 1, wherein the second filter region is formed of a white filter.

3. The apparatus of claim 1, wherein the image sensor comprises photoelectric conversion layers each having a different spectral sensitivity and the photoelectric conversion layers are formed at a location corresponding to the first filter region.

4. The apparatus of claim 3, wherein the photoelectric conversion layers comprise:
    a first photoelectric conversion layer passing a first color component of a light signal that passes through the first filter region; and
    a second photoelectric conversion layer longitudinally overlapping the first photoelectric conversion layer and passing a second color component of the light signal that passes through the first filter region,
    wherein the first photoelectric conversion layer is located closer to a surface of a substrate than the second photoelectric conversion layer.

5. The apparatus of claim 4, wherein the first photoelectric conversion layer generates electric charges according to the first color component, and the second photoelectric conversion layer generates electric charges according to the second color component.

6. The apparatus of claim 4, wherein the first photoelectric conversion layer has a p-n junction located at a first depth from the surface of the substrate, and the second photoelectric conversion layer has a p-n junction located at a second depth from the surface of the substrate.

7. The apparatus of claim 4, wherein the image sensor unit calculates a color difference signal based on a luminance signal sensed from a light signal that passes through the third filter region, a signal sensed from the first photoelectric conversion layer, and a signal sensed from the second photoelectric conversion layer.

8. A method of operating an image photographing apparatus, the method comprising:
    filtering an incident light signal using a first filter region comprising a first sub-filter region which passes a first wavelength band of the incident light signal corresponding to a complementary color of a first color, a second sub-filter region which passes a second wavelength band of the incident light signal corresponding to a complementary color of a second color, a second filter region which passes all wavelength bands of the incident light signal, and a third filter region including a white filter which blocks an infrared wavelength band of the incident light signal;
    receiving the filtered light signal through a plurality of photoelectric conversion layers having different spectral sensitivity; and
    sensing an image from the received light signal,
    wherein each of the first sub-filter region and the second sub-filter region is formed of any one of a cyan filter, a magenta filter, and a yellow filter, and
    wherein the first sub-filter region and the second sub-filter region are formed adjacent to each other in a first row and the second filter region and the third filter region are formed adjacent to each other in a second row that is consecutive to the first row.

9. The method of claim 8, wherein the second filter region is formed of a white filter.

10. The method of claim 8, wherein the photoelectric conversion layers are formed at a location corresponding to the first filter region.

11. The method of claim 8, wherein the photoelectric conversion layers comprise:
   a first photoelectric conversion layer passing a first color component of a light signal that passes through the first filter region; and
   a second photoelectric conversion layer longitudinally overlapping the first photoelectric conversion layer and passing a second color component of the light signal that passes through the first filter region,
   wherein the first photoelectric conversion layer is located closer to a surface of a substrate than the second photoelectric conversion layer.

12. The method of claim 11, wherein the first photoelectric conversion layer generates electric charges according to the first color component, and the second photoelectric conversion layer generates electric charges according to the second color component.

13. The method of claim 11, wherein the first photoelectric conversion layer has a p-n junction located at a first depth from the surface of the substrate, and the second photoelectric conversion layer has a p-n junction located at a second depth from the surface of the substrate.

14. The method of claim 11, wherein the sensing of the image comprises calculating a color difference signal based on a luminance signal sensed from a light signal that passes through the third filter region, a signal sensed from the first photoelectric conversion layer, and a signal sensed from the second photoelectric conversion layer.

15. At least one non-transitory medium comprising computer readable code to control at least one processing element to implement the method of claim 8.

16. An image photographing apparatus comprising:
   a filter unit including,
      a first filter region including,
         a first sub-filter region to pass a first wavelength band of an incident light signal corresponding to a complementary color of a first color,
         a second sub-filter region to pass a second wavelength band of the incident light signal corresponding to a complementary color of a second color,
      a second filter region to pass all bands of the incident light signal, and
      a third filter region including a white filter which blocks an infrared wavelength band of the incident light signal,
      wherein the first sub-filter region and the second sub-filter region are arranged parallel to each other as adjacent pixels and are each formed of any one of a cyan filter, a magenta filter, and a yellow filter, and the second filter region and the third filter region are arranged parallel to each other as adjacent pixels; and
   an image sensor unit to sense an image from the incident light signal that passes through the filter unit, the image sensor unit including a plurality of photoelectric conversion layers each having a different spectral sensitivity.

17. The apparatus of claim 16, wherein the photoelectric conversion layers are formed at a location corresponding to the first filter region.

18. The apparatus of claim 16, wherein the photoelectric conversion layers comprise:
   a first photoelectric conversion layer passing a first color component of a light signal that passes through the first filter region; and
   a second photoelectric conversion layer longitudinally overlapping the first photoelectric conversion layer and passing a second color component of the light signal that passes through the first filter region,
   wherein the first photoelectric conversion layer is located closer to a surface of a substrate than the second photoelectric conversion layer.

19. A method of operating an image photographing apparatus, the method comprising:
   filtering an incident light signal using a first filter region including a first sub-filter region to pass a first wavelength band of the incident light signal corresponding to a complementary color of a first color and a second sub-filter region to pass a second wavelength band of the incident light signal corresponding to a complementary color of a second color, using a second filter region to pass all wavelength bands of the incident light signal, and using a third filter region including a white filter which blocks an infrared wavelength band of the incident light signal, wherein the first sub-filter region and the second sub-filter region are arranged parallel to each other as adjacent pixels and are each formed of any one of a cyan filter, a magenta filter, and a yellow filter, and the second filter region and the third filter region are arranged parallel to each other as adjacent pixels;
   receiving the filtered incident light signal through a plurality of photoelectric conversion layers each having a different spectral sensitivity; and
   sensing an image from the received light signal.

20. The method of claim 19, wherein the receiving of the filtered incident light signal comprises:
   receiving a first color component and a second color component from the incident light signal that passes through the first filter region,
   wherein the first color component is obtained by a first photoelectric conversion layer and the second color component is obtained by a second photoelectric conversion layer, the first photoelectric conversion layer being located closer to the surface of a substrate than the second photoelectric conversion layer.

21. The method of claim 20, wherein the receiving of the filtered incident light signal further comprises obtaining a white light signal from the incident light signal that passes through the second filter region.

22. The method of claim 21, further comprising
   performing white balancing on the first color component and the second color component using the obtained white light signal;
   performing demosaicing on the white balanced first color component signal and on the white balanced second color component signal
   generating an image in a predetermined signal format and gamma correcting the generated image; and
   outputting the gamma-corrected image to a predetermined display module.

23. At least one non-transitory medium comprising computer readable code to control at least one processing element to implement the method of claim 19.

* * * * *